US006449726B1

(12) United States Patent
Smith (10) Patent No.: US 6,449,726 B1
(45) Date of Patent: Sep. 10, 2002

(54) METHOD, SYSTEM, SOFTWARE, AND SIGNAL FOR ESTIMATING BATTERY LIFE IN A REMOTE CONTROL DEVICE

(75) Inventor: Kim C. Smith, Colleyville, TX (US)

(73) Assignee: Spotware Technologies, Inc., North Sioux City, SD (US)

( * ) Notice: Subject to any disclaimer, the term of this patent is extended or adjusted under 35 U.S.C. 154(b) by 0 days.

(21) Appl. No.: 09/357,792

(22) Filed: Jul. 21, 1999

(51) Int. Cl.[7] .................. G06F 1/28; H01M 10/44
(52) U.S. Cl. .................. 713/340; 324/427; 340/636
(58) Field of Search ................ 713/300, 321, 713/310, 340; 702/60–64, 127; 320/106, 134, 137, 149; 324/428, 433, 427; 340/636; 700/291; 345/810, 771; 429/90; 307/66

(56) References Cited

U.S. PATENT DOCUMENTS

| 4,743,831 A | | 5/1988 | Young ..................... 320/48 |
|---|---|---|---|
| 5,341,503 A | * | 8/1994 | Gladstein et al. |
| 5,565,759 A | | 10/1996 | Dunstan ..................... 320/48 |
| 5,606,242 A | * | 2/1997 | Hull et al. |
| 5,691,742 A | * | 11/1997 | O'Connor et al. |
| 5,714,870 A | * | 2/1998 | Dunstan |
| 6,023,150 A | * | 2/2000 | Patino et al. |
| 6,194,870 B1 | * | 2/2001 | Kim |
| 6,211,858 B1 | * | 4/2001 | Moon et al. |
| 6,317,697 B1 | * | 11/2001 | Yoshikawa et al. |
| 6,353,800 B1 | * | 3/2002 | Rector |

* cited by examiner

Primary Examiner—Gopal C. Ray
(74) Attorney, Agent, or Firm—Chad Swantz (57) ABSTRACT

The present invention describes a method, signal, and software for use in a system including a host device and at least one remote battery powered device. The status of the battery in the remote device is estimated from the number and duration of messages received by the host. The battery's status is then communicated to the user via the host device. The entire method can be implemented without consuming any battery power except the power normally used to transmit messages.

28 Claims, 5 Drawing Sheets

METHOD, SYSTEM, SOFTWARE, AND SIGNAL FOR ESTIMATING BATTERY LIFE IN A REMOTE CONTROL DEVICE

FIELD OF THE INVENTION

The present invention relates generally to systems that include a battery powered device and more particularly to systems, software programs, signals, and methods estimating remaining battery life.

BACKGROUND OF THE INVENTION

It seems that, like almost every device known to man, battery powered devices are subject to Murphy's Law: which explains why the batteries in those devices tend to die without warning and at the most inopportune times. Having a device unexpectedly malfunction because of a weak battery can be very frustrating, especially if no replacement batteries are available. As anyone who has experienced the unexpected failure of a battery powered device will attest, it would be very helpful to have an advance indication of exactly when a battery was going to fail so that arrangements could be made to have replacement batteries on hand when needed.

There are methods currently available for measuring the remaining charge on a battery and notifying a user that the battery is low. A simple example is the battery light on an automobile's instrument panel. When the car's battery voltage drops below a certain level, a lamp is illuminated to let the driver know that there is a problem. Methods similar to the one just mentioned are sometimes adapted for use in portable battery powered devices.

The primary disadvantage of these methods, however, is that to some extent measuring the remaining charge consumes battery power. Similarly, notifying a user of the low battery condition, usually by illuminating a lamp or light emitting diode (LED), drains even more power from the battery. Add to increased battery drain the fact that status lamps are sometimes not easily seen by a user, and it should be apparent that current methods of measuring the remaining charge on a battery and notifying a user when the battery is low are inadequate, particularly when dealing with devices using smaller batteries, which are not capable of delivering large amounts of power.

Therefore, what is needed is a system, software signal, and method for estimating remaining battery life and clearly notifying a user of impending battery failure without draining additional power from the battery.

SUMMARY OF THE INVENTION

Accordingly, the present invention provides a method, in a system including a host device and at least one remote battery powered device, comprising the actions of maintaining information relating to battery life, metering periods of remote device use, and estimating remaining battery life from the periods of use and the information relating to battery life.

In addition, the present invention provides a system including a host device and at least one remote battery powered device comprising at least one processor, memory operably associated with the processor, and a program of instructions configured to be executed by the processor and stored in the memory. The program of instructions includes instructions configured to maintain information relating to battery life, meter periods of remote device use, and estimate remaining battery life from the periods of use and the information relating to battery life.

The present invention also provides a computer readable medium tangibly embodying a series of instructions, for use in a system including a host device and at least one remote battery powered device, implementing maintaining information relating to battery life, metering periods of remote device use, and estimating remaining battery life from the periods of use and the information relating to battery life.

Furthermore, the present invention provides a signal embodied in a propagation medium, for use in a system including a host device and at least one remote battery powered device, comprising at least one instruction configured to maintain information relating to battery life, at least one instruction configured to meter periods of remote device use, and at least one instruction configured to estimate remaining battery life from the periods of use and the information relating to battery life.

It is an object of the present invention to provide a method of estimating the remaining battery life of a battery used in a remote device without consuming power from the remote device's battery to do so.

It is also an object of the present invention to provide a method of clearly notifying a user of an impending failure of a battery used in a remote device without consuming power from the remote device's battery to do so.

An advantage of the present invention is that a remote device's battery is not drained by the monitoring process.

Another advantage of the present invention is that a remote device's battery is not drained by notifying a user of the battery's status.

A further advantage of the present invention is that it provides a clear indication of a battery's status.

An additional advantage of the present invention is that the method can be implemented independently of a specific remote device.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

DETAILED DESCRIPTION OF A PREFERRED EMBODIMENT OF THE INVENTION

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

Figure 1:
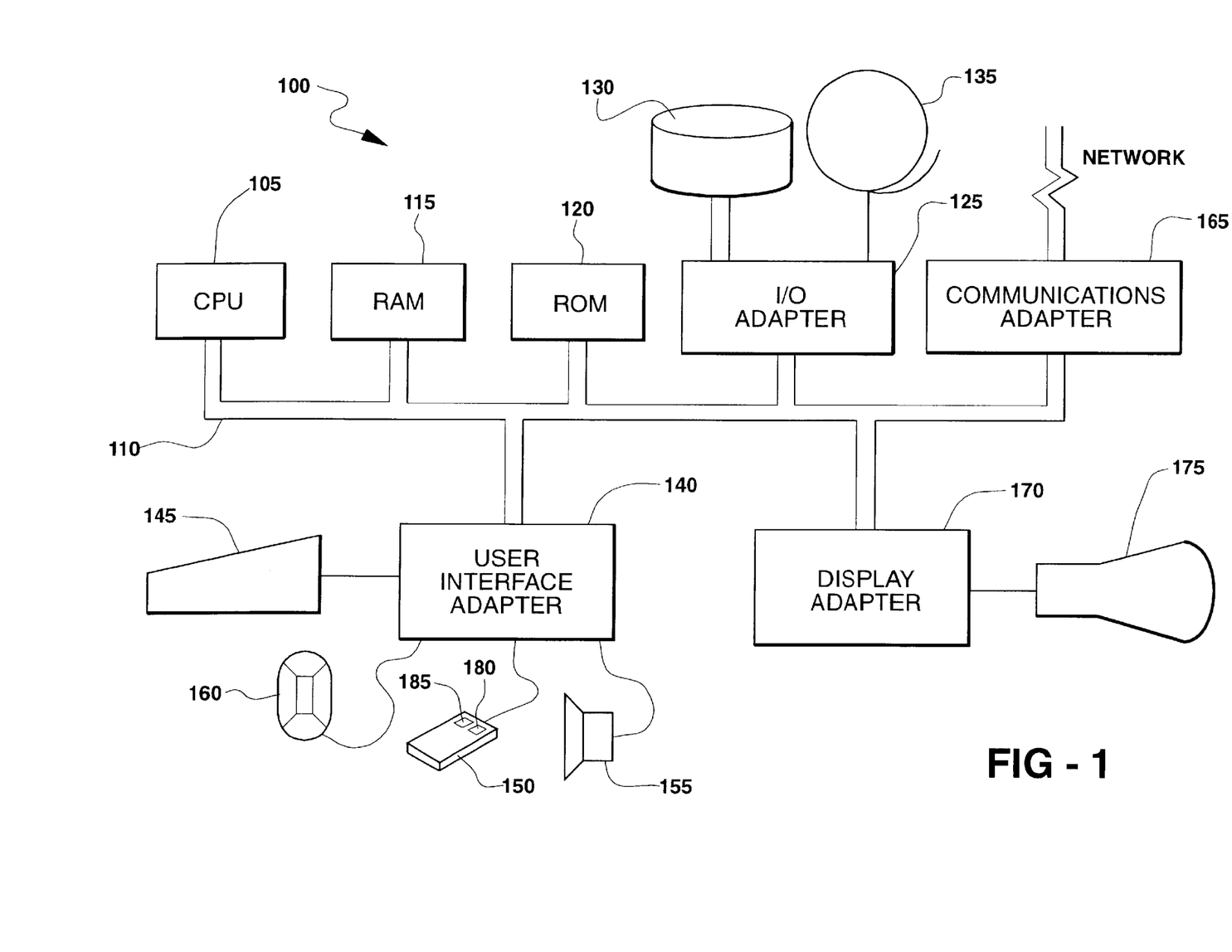
FIG. 1 illustrates a detailed block diagram showing a computer system according to a preferred embodiment of the present invention.

A representative hardware environment for practicing the present invention is depicted in FIG. 1, which illustrates a typical hardware configuration of an information handling system 100 in accordance with the present invention, having a central processing unit 105, such as a conventional microprocessor, and a number of other units interconnected via at least one system bus 110. Information handling system 100 may be, for example, a portable or desktop Gateway computer or a Gateway Destination system (Gateway and Destination are trademarks of Gateway 2000, Inc.). Information handling system 100 shown in FIG. 1 includes random access memory (RAM) 115, read-only memory (ROM) 120 wherein the ROM 120 could also be erasable programmable read-only memory (EPROM) or electrically erasable programmable read-only memory (EEPROM), and input/output (I/O) adapter 125 for connecting peripheral devices such as disk units 130 and tape drives 135 to system bus 110, a user interface adapter 140 for connecting keyboard 145, mouse 150, speaker 155, microphone 160, and/or other user interface devices to system bus 110, communications adapter 165 for connecting information handling system 100 to an information network such as the Internet, and display adapter 170 for connecting system bus 110 to a display device such as monitor 175. Mouse 150 has a series of buttons 180, 185 and is used to control a cursor shown on monitor 175.

Figure 2:
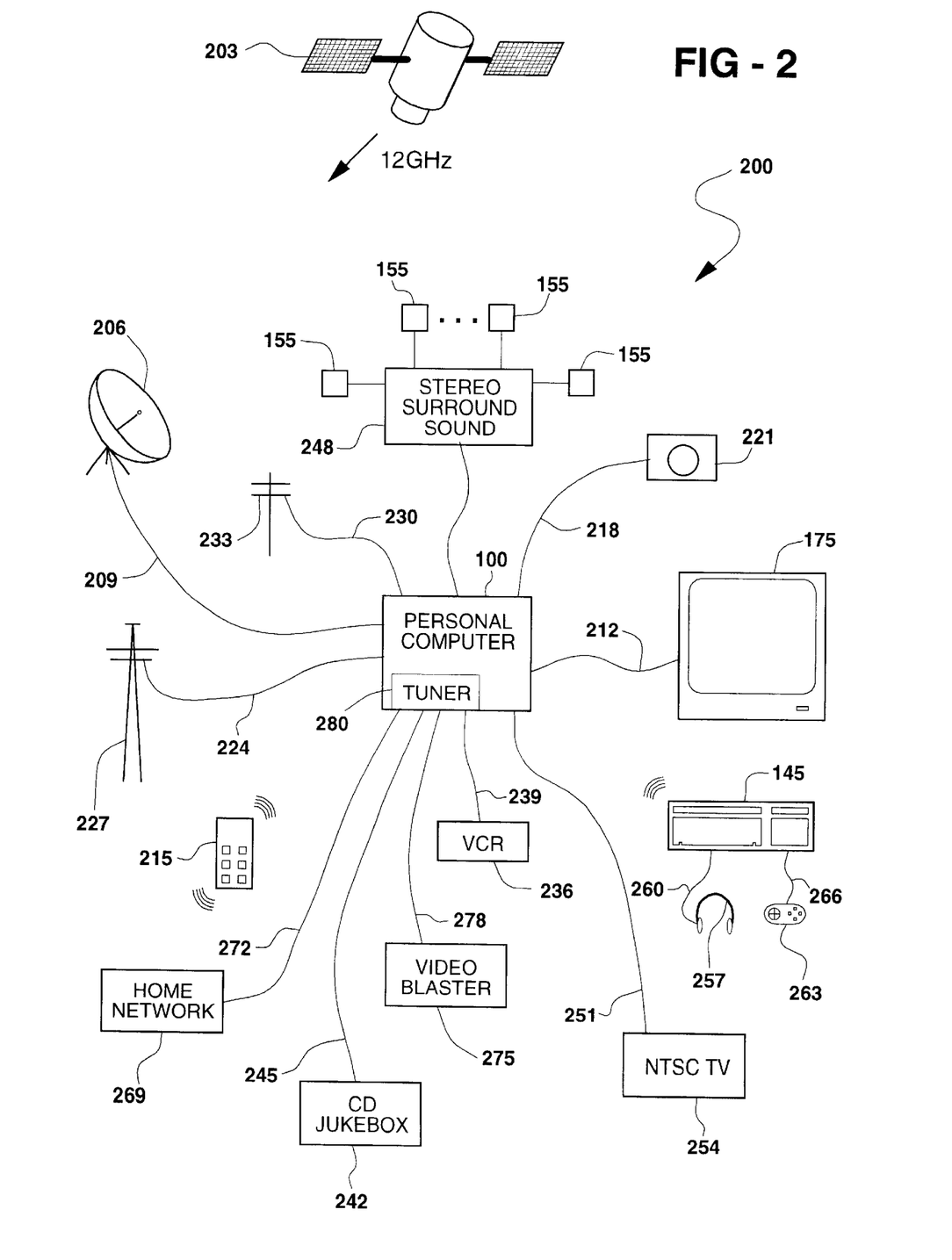
FIG. 2 illustrates a detailed block diagram showing a convergence system according to the preferred embodiment of the present invention.

Referring next to FIG. 2, a system 200 is shown in general detail. Reference numerals or letters in FIG. 2 which are like, similar, or identical to the reference numerals or letters of FIG. 1 indicate like, similar, or identical components or features. External to system 200 is satellite 203 which, in one preferred embodiment, is a HS601 model operated by Hughes at a 101 degree west longitude geosynchronous orbital location. Satellite 203 transmits signals comprising 150 channels of modulated digital video, audio, and data at a frequency of about 12 Ghz. The satellite signals are received by system 200 by antenna 206 containing a low noise block converter amplifier. Antenna 206 is preferably about 18 inches in diameter and receives left-hand and right-hand circularly polarized signals between 12.2 and 12.7 Ghz. Antenna 206 provides a "down converted-spectrum" signal between 950 and 1450 MHZ via a coaxial cable or other suitable communication medium 209 to information handling system 100, such as a personal computer or other system or circuitry capable of processing data. Suitable antennas 206 are already being manufactured and sold by RCA corporation by direct sales and through numerous major retail chains such as Radio Shack.

System 100 contains circuitry and software to further process signals from the antenna, generally demodulating and decoding the signal to produce a VGA (video graphics adapter) signal. The VGA signal is provided via standard VGA compatible monitor cable 212 to drive large screen data quality monitor 175 suitable for viewing in a family room or entertainment room environment. System 100 provides for user input by means of remote controls 215 and 145. Remote control 215 comprises a handheld size device with standard television controls and a numeric keypad and, in one embodiment, video cassette recorder (VCR) controls and a pointing device. It provides radio frequency (RF) or infrared (IR) control signals received by system 100. Remote control 145 is a full function personal computer keyboard with additional standard television and VCR controls, a pointing device which is preferably in the form of a touchpad, and it also provides RF control signals to system 100. RF control signals were selected over IR or hardwired in one embodiment due to the home entertainment environment. Monitor cable 212 is a standard type cable typically used on VGA display devices and comprises up to 15 electrical conductors interfacing with monitor 175 in a D-series shell connector. In one embodiment, full multimedia sourcing and destinationing of audio/video/data (A/V/D) broadcast are provided for. Although the embodiment presented herein discusses the use of VGA signals, it should be mentioned that with an appropriate change in hardware, National Television Standard Committee (NTSC) compliant signals and NTSC compliant hardware will employ the present invention in the manner mentioned herein.

Information handling system 100 may include a tuner, tuner circuitry 280, or card capable of both tuning to multiple channels and receiving television information or signals in the form of the NTSC or Phase Alteration Line (PAL) form from any medium 116 carrying signals from satellite dish 206 which provides digital A/V/D signals from such sources as DirecTV or Primestar (DirecTV is a trademark of DirecTV, Inc., and Primestar is a trademark of Primestar Partners, L.P.). In another such embodiment, the signals carried on medium 209 provide analog A/V such as NTSC antenna signals. In another such embodiment, the signal carried on medium 218 from camera 221 provides analog A/V such as NTSC audio/video signals. In further embodiments, the signal carried on medium 224 from cable-data source 227 provides analog and/or digital A/V/D. In further such embodiments, the signal carried on medium 230 from Public Switched Telephone Network (PSTN) 233 provides data or phone signals such as integrated services digital network (ISDN) or plain old telephone system (POTS) signals. In one set of such embodiments, system 100 is programmed to automatically record analog signals, such as television programming, onto recordable media, such as a video tape in VCR 236 coupled to cable 239. In another such set of embodiments, system 100 is programmed to automatically record digital signals, such as digital television programming, Digital Versatile Disk (DVD) programming, or compact disk read-only memory (CD-ROM) type audio, onto recordable media, such as recordable compact disks, in CD/DVD jukebox 242 coupled to cable 245. CD/DVD jukebox 242 also plays CDS, CD-ROMs or DVDs for use elsewhere. In another such embodiment, signals are sent to stereo surround system 248 for audio output to one or more speakers 155, and on cable 251 to TV 254. In one such embodiment, earphones 257 on cable 260 and game pad 263 on cable 266 provide additional input/output through remote control 145. Home network 269 is "smart wiring" used to transmit data and control within the home, coupled by cable 272 to system 100. Videoblaster 275 provides video signal processing on cable/connector 278. Cables 224, 209, 230, 218, 251, 239, 278, 245, 260, and 153 can be wired coupling or wireless, such as RF or IR.

One example of convergence system 200 is the Destination System using the DestiVu user or media interface manufactured and sold by Gateway 2000, Inc. In this manner, convergence system 200 is a fully functional computer integrated with a television, providing TV viewing (via broadcast, cable, satellite, VCR, digital disk, or other broadcast media) and personal computing functionality. This convergence of computer and television enables a user combined access to both television programs and information and computer related functionality such as computer information and programs and Internet access.

Although many of today's televisions employ many of the same hardware resources employed by computers, such as information handling system 100, it is possible that the present invention might be practiced in other electronic devices or networked electronic devices. For example, with the development of audio/video networking, such as the recently proposed HAVi standard, television sets or other audio/video devices, such as audio/video receivers and VCRs, that do not themselves contain such resources could implement the present invention by using the resources of other devices on a network.

Figure 3:
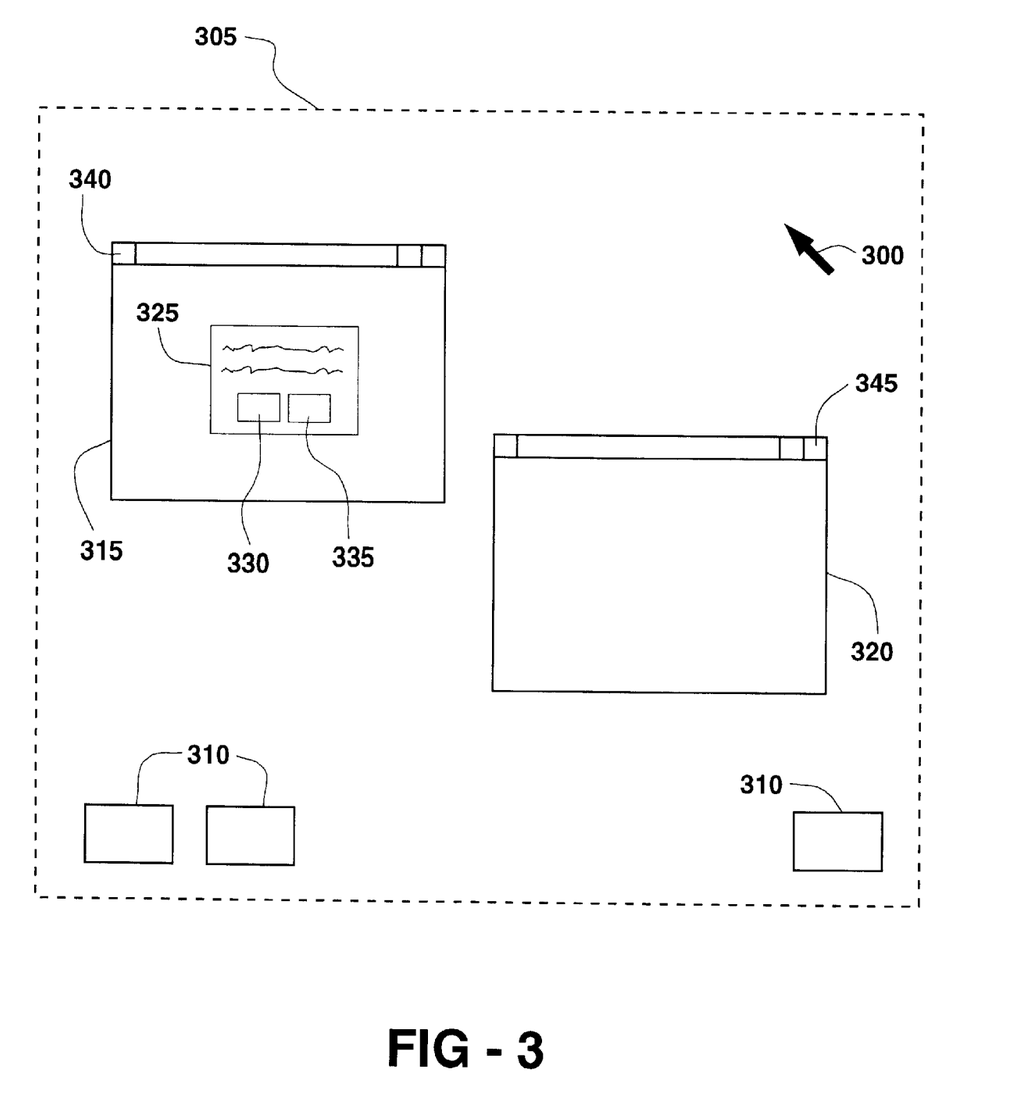
FIG. 3 shows the desktop of a computer operating system's user interface, typically employed on a computer system as in FIGS. 1 and 2, according to the preferred embodiment of the present invention.

Referring next to FIG. 3, a detail of an operating system's graphical user interface, or GUI, as is typically displayed on monitor 175 in accordance with the present invention is illustrated. Reference numerals or letters in FIG. 3 which are like, similar, or identical to the reference numerals or letters of FIGS. 1–2 indicate like, similar, or identical components or features. The operating system shown in FIG. 3 is IBM's OS/2 (OS/2 is a trademark of International Business Machines Corporation), however, the present invention will work with DestiVu, Windows 98, Windows 95 (DestiVu is a trademark of Gateway 2000 Inc. and Windows 98 and Windows 95 are trademarks of Microsoft Corporation), or any other graphical user interface. This GUI includes cursor 300, desktop 305, three icons 310, two windows 315, 320, and dialog box 325, all of which are well known in the art. Dialog box 325 further contains two buttons 330, 335. Programs are represented by the graphical user interface as either icons 310 or windows 315, 320. The horizontal region along the top of a window is called the "title bar" 340, 345. A program window 315, 320 has the "focus" when it has been designated by the user or by the operating system to receive input from keyboard 145 or mouse 150. In OS/2®, the user gives the window focus by clicking a mouse button 180, 185 when cursor 300 is inside that window. Some operating systems, however, give a window the focus merely whenever cursor 300 is present within that window. The operating system indicates which program has the focus by changing the color of the focused window's title bar 340, 345.

Figure 4:
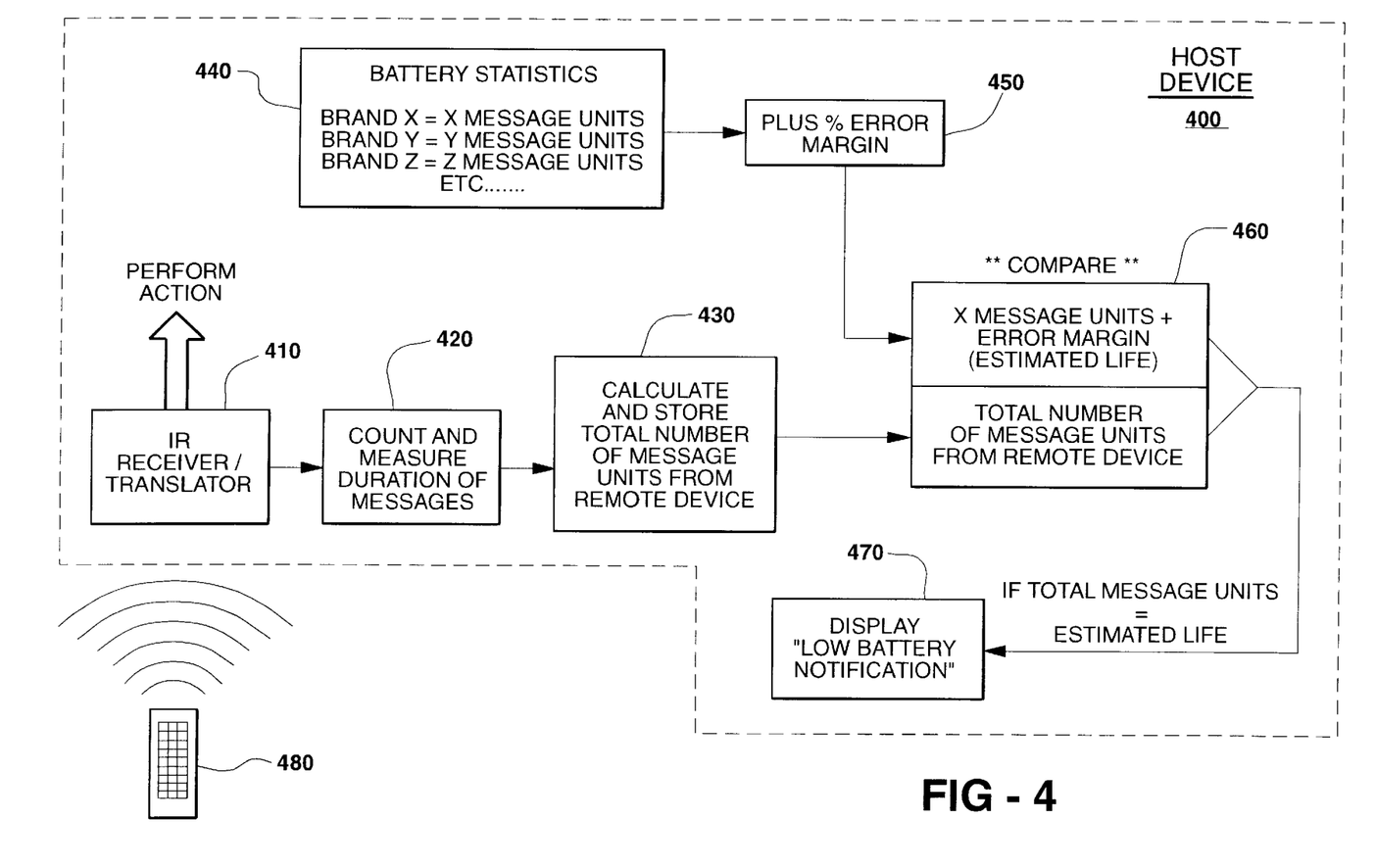
FIG. 4 illustrates a block diagram of the method of the preferred embodiment of the present invention.
Figure 5:
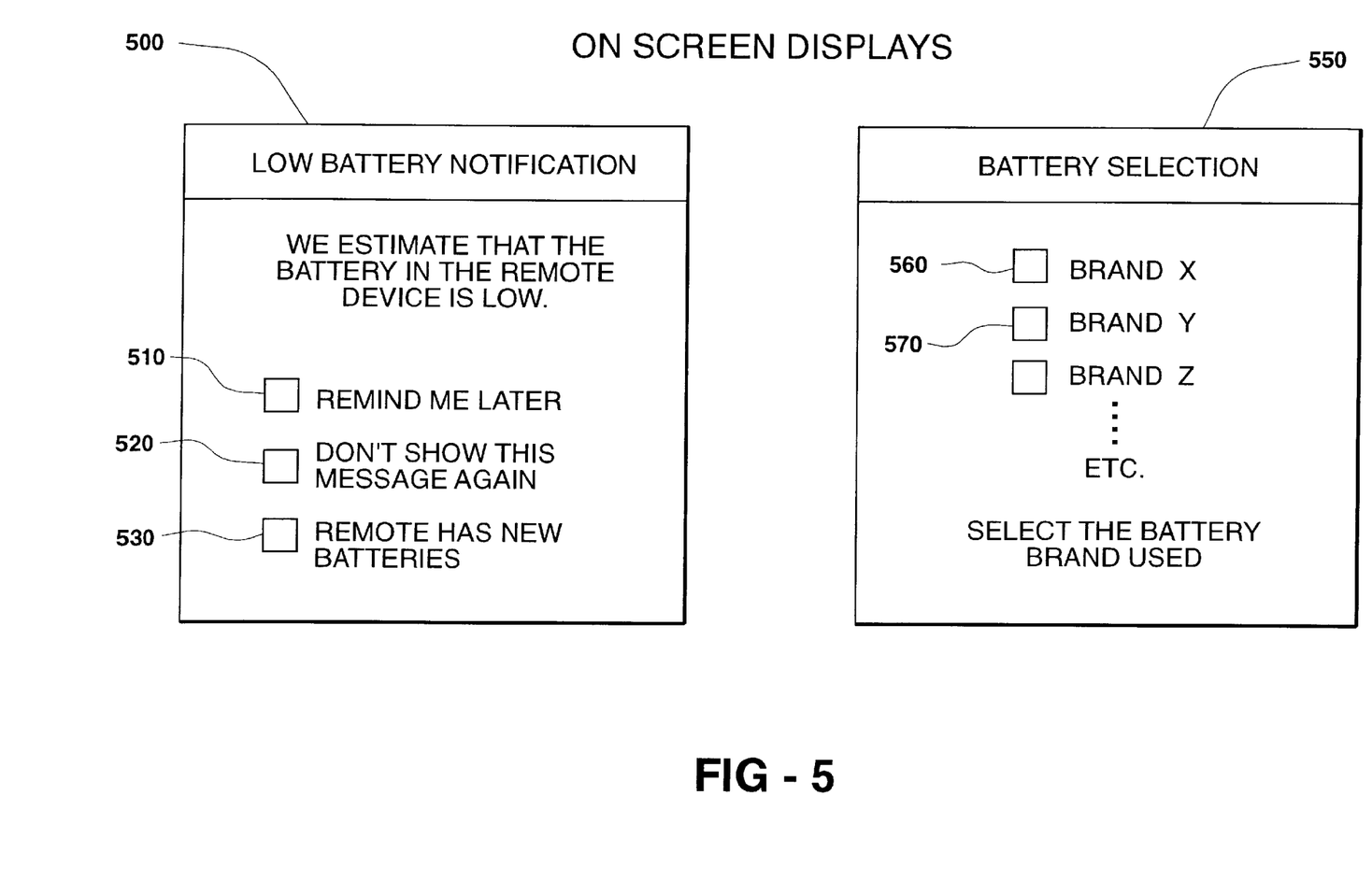
FIG. 5 illustrates a series of on-screen displays for obtaining user input according to the preferred embodiment of the present invention

Refer to FIGS. 4 and 5 for a graphical representation of the method of the present invention according to the preferred embodiment. The remote device 480 is used to send commands to a host device 400, for example, the Gateway Destination system. Other remote devices can be used, for example, the keyboard 145, game pad 263, or any brand of remote control 215 that uses, in the preferred embodiment, infrared (IR) technology. If an alternate host device is used, any remote device compatible with the host device can be employed, regardless of whether IR or some other technology is used.

In the preferred embodiment of the present invention, the host 400 counts the number of messages received 420 from the remote device 480, measures the duration of each message, and converts this information into message units 420. By knowing the number of messages received from the remote device, and the messages' durations, host software can calculate the total number of message units received 430 from a remote device 480. For example, one command with a duration of 0.5 seconds may be defined as one message unit. Two commands of 0.25 seconds each would therefore be assigned a value of one message unit; and one command lasting one second would be assigned a value of two message units. If 500 messages of 0.5 seconds duration were received by the host, the total number of message units received would be 500. It will be obvious to one skilled in the art that the previous example is just one way to define message units and that message units can be defined in any manner desired as long as the definition is used consistently.

In the preferred embodiment of the present invention, information associated with battery life can be stored using any of the system's storage devices 115, 130, 135, 120. The information includes statistics describing battery ratings, given in message units, for various battery types and brands 440. For instance, a Brand X battery 560 may last for 10,000 message units, and a Brand Y battery 570 may last for 11,000 message units. To let the system know whether Brand X or Brand Y batteries are installed in the remote device, a user can simply choose the battery type from a "Battery Selection" menu 550. In one embodiment of the present invention, the "Battery Selection" menu 550 is displayed after a user selects the appropriate menu item from the "Low Battery Notification" menu 500. However, the "Battery Selection" menu 550 could also be displayed at other times, for example, upon system initialization.

By comparing the total message units received from the remote device with the battery life statistics 460, the system can estimate when the battery will need to be replaced. Suppose that the host 400 has received 8,000 message units from a remote device, and a battery installed in the remote device is rated for 10,000 message units. In the preferred embodiment of the present invention, when the total number of message units received from the remote device, plus a margin for error 450, exceeds a predetermined threshold, a message is displayed on the system monitor 175. To add to the previous example, recall that the battery in the remote device is rated for 10,000 message units. If the margin for error is 2,000 message units, then the threshold for user notification is 8,000 message units. Since the battery has already been used for 8,000 message units, after the next message unit from the remote device is received by the host, a "Low Battery Notification" menu 500 will be displayed on the monitor, notifying the user of the low battery status. The user may then install a new battery in the remote device and notify the system using the "Battery Selection" menu 550. After a battery is selected using the "Battery Selection" menu 550, the system resets the total message units received from the remote device to zero, and the process of counting and measuring the duration of messages begins again.

By displaying the message on the system monitor 175, the user will receive a clear indication of the battery's status without consuming additional battery power. In one embodiment of the present invention, in addition to displaying an on screen "Low Battery Notification" menu 500, the user is required to select an option from the menu before the menu is cleared off the screen, virtually guaranteeing that the message will be seen. The menu options in the "Low Battery Notification" menu 500 include, but are not limited to, the following: "Remind me later" 510 which will cause the "Low Battery Notification" menu 500 to be displayed again at a later time, "Don't show this message again" 520 which will remove the message from the display, and "Remote has new batteries" 530 which will display the "Battery Selection" menu 550 previously discussed. Again, this is only one embodiment of the present invention. The user notification may be realized as a warning on the lower part of the screen, similar to the way weather advisories during television broadcasts are displayed, an audio message could be generated, or possibly a combination of visual and audio messages could be used to notify the user of a battery's status. In an alternate embodiment of the present invention, the message may be displayed at times other than when the estimated remaining battery life is low; for example, a display may be generated periodically to indicate battery status regardless of the remaining battery life.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

One of the preferred implementations of the invention is as sets of instructions resident in the random access memory 115 of one or more computer or information handling systems configured generally as described in FIGS. 1–5. Until required by the computer system, the set of instructions may be stored in another computer readable memory, for example, in a hard disk drive or in a removable memory such as an optical disk for eventual use in a CD-ROM drive or a floppy disk for eventual use in a floppy disk drive. Further, the set of instructions can be stored in the memory of another computer and transmitted over a local area network or a wide area network, such as the Internet, where the transmitted signal could be a signal propagated through a medium such as an ISDN line, or the signal may be propagated through an air medium and received by a local satellite whereupon being transferred to the computer or information handling system of the preferred embodiment where the signal is a composite signal comprising a carrier signal, and contained within the carrier signal is the desired information containing at least one computer program instruction implementing the invention and may be downloaded as such when desired by the user. One skilled in the art would appreciate that the physical storage and/or transfer of the sets of instructions physically changes the medium upon which it is stored electrically, magnetically, or chemically so that the medium carries computer readable information. The invention is limited only by the following claims and their equivalents.

What is claimed is:

1. A method, in a system including a host device and at least one remote battery powered device, said host device and at least one remote battery powered device being operably connected via a wireless connection, comprising the steps of:
    maintaining information relating to battery life;
    metering periods of remote device use; and
    estimating remaining battery life from the periods of use and the information relating to battery life.

2. The method of claim 1 wherein metering comprises:
    counting remote device activations; and
    measuring remote device activation periods.

3. The method of claim 1 wherein the host device is fully powered.

4. The method of claim 1 wherein the information relating to battery life includes statistics for a variety of batteries.

5. The method of claim 1 wherein the method is implemented in the host device.

6. The method of claim 1 further including the action of notifying a user of the remote device's battery status.

7. The method of claim 6 wherein the action of notifying is implemented in the host device.

8. A system comprising:
    a remote battery powered device; and
    a host device; said host device being operably connected to said remote battery powered device via a wireless connection, said host device including:
        a least one processor;
        memory operably associated with said processor; and
        a program of instructions configured to be executed by said processor and stored in said memory, said program of instructions including limitations configured to maintain information relating to battery life, meter periods of remote device use and estimate remaining battery life from said periods of use and said information relating to battery life.

9. The system of claim 8 wherein metering comprises:
    counting remote device activations; and
    measuring remote device activation periods.

10. The system of claim 8 wherein said host device is fully powered.

11. The system of claim 8 wherein said information relating to battery life includes statistics for a variety of batteries.

12. The system of claim 8 wherein said program of instructions is executed in said host device.

13. The system of claim 8 wherein said program of instructions is further configured to notify a user of said remote device's battery status.

14. The system of claim 13 wherein said user notification is implemented in said host device.

15. A computer readable medium tangibly embodying a series of instructions for use in a system including a host device and at least one remote battery powered device, said host device being operably connected to at least one remote battery powered device via a wireless connection, implementing the following method:
    maintaining information relating to battery life;
    metering periods of remote device use; and
    estimating remaining battery life from said periods of use and said information relating to battery life.

16. The computer readable medium of claim 15 wherein metering comprises:
    counting remote device activations; and
    measuring remote device activation periods.

17. The computer readable medium of claim 15 wherein said host device is fully powered.

18. The computer readable medium of claim 15 wherein said information relating to battery life includes statistics for a variety of batteries.

19. The computer readable medium of claim 15 wherein said method is implemented in said host device.

20. The computer readable medium of claim 15 wherein said method further implements notifying a user of said remote device's battery status.

21. The computer readable medium of claim 20 wherein said notifying is implemented in said host device.

22. A signal embodied in a propagation medium, for use in a system including a host device and at least one remote battery powered device, said host device being operably connected to at least one remote battery powered device via a wireless connection, comprising:

at least one instruction configured to maintain information relating to battery life;

at least one instruction configured to meter periods of remote device use; and at least one instruction configured to estimate remaining battery life from said periods of use and said information relating to battery life.

23. The signal of claim 22 wherein metering comprises:

counting remote device activations; and measuring remote device activation periods.

24. The signal of claim 22 wherein said host device is fully powered.

25. The signal of claim 22 wherein said information relating to battery life includes statistics for a variety of batteries.

26. The signal of claim 22 wherein said instructions are further configured to be implemented in said host device.

27. The signal of claim 22 further including at least one instruction configured to notify a user of said remote device's battery status.

28. The signal of claim 27 wherein said instruction configured to notify a user is implemented in the host device.

* * * * *